United States Patent
Tan

(10) Patent No.: US 11,430,818 B2
(45) Date of Patent: Aug. 30, 2022

(54) METHOD OF MANUFACTURING LIGHT EMITTING PANEL, LIGHT EMITTING PANEL, AND DISPLAY DEVICE

(71) Applicant: SHENZHEN CHINA STAR OPTOELECTRONICS TECHNOLOGY CO., LTD., Shenzhen (CN)

(72) Inventor: Zhiwei Tan, Shenzhen (CN)

( * ) Notice: Subject to any disclaimer, the term of this patent is extended or adjusted under 35 U.S.C. 154(b) by 81 days.

(21) Appl. No.: 16/496,965

(22) PCT Filed: May 17, 2019

(86) PCT No.: PCT/CN2019/087332
§ 371 (c)(1),
(2) Date: Sep. 24, 2019

(87) PCT Pub. No.: WO2020/215411
PCT Pub. Date: Oct. 29, 2020

(65) Prior Publication Data
US 2021/0167119 A1 Jun. 3, 2021

(30) Foreign Application Priority Data

Apr. 24, 2019 (CN) .......................... 201910333662.3

(51) Int. Cl.
| H01L 27/12 | (2006.01) |
| H01L 27/15 | (2006.01) |
| H01L 33/00 | (2010.01) |
| H01L 33/44 | (2010.01) |

(52) U.S. Cl.
CPC ........ *H01L 27/1288* (2013.01); *H01L 27/156* (2013.01); *H01L 33/0095* (2013.01); *H01L 33/44* (2013.01)

(58) Field of Classification Search
None
See application file for complete search history.

(56) References Cited

U.S. PATENT DOCUMENTS

| 5,989,930 | A | * | 11/1999 | Lu ............................ G01N 1/28 438/16 |
| 2007/0093003 | A1 | | 4/2007 | Wu et al. |
| 2014/0097468 | A1 | * | 4/2014 | Okita .................. H01L 29/7787 257/192 |

(Continued)

FOREIGN PATENT DOCUMENTS

| CN | 1959942 A | 5/2007 |
| CN | 101359616 A | 2/2009 |

(Continued)

*Primary Examiner* — Anthony Ho
*Assistant Examiner* — Kevin Quinto

(57) ABSTRACT

A method of manufacturing a light emitting panel, a light emitting panel, and a display device are disclosed. The method includes providing a substrate, forming a first metal layer on the substrate, performing an oxidation process to the first metal layer to form an oxide layer on the first metal layer, forming a photoresist layer on the oxide layer, patterning the photoresist layer, the oxide layer, and the substrate, and stripping a patterned photoresist layer, and sequentially forming a first passivation layer, a color resist layer, a second passivation layer, and an indium tin oxide film layer on the oxide layer.

10 Claims, 6 Drawing Sheets

(56) References Cited

U.S. PATENT DOCUMENTS

| | | | |
|---|---|---|---|
| 2017/0003553 A1* | 1/2017 | Choi | H01L 27/124 |
| 2019/0057938 A1 | 2/2019 | Mai et al. | |
| 2020/0135767 A1* | 4/2020 | Ge | H01L 21/0262 |

FOREIGN PATENT DOCUMENTS

| | | |
|---|---|---|
| CN | 101908478 A | 12/2010 |
| CN | 108198756 A | 6/2018 |
| CN | 108550626 A | 9/2018 |
| CN | 109103140 A | 12/2018 |
| CN | 109411482 A | 3/2019 |
| CN | 109585381 A | 4/2019 |

* cited by examiner

METHOD OF MANUFACTURING LIGHT EMITTING PANEL, LIGHT EMITTING PANEL, AND DISPLAY DEVICE

FIELD OF INVENTION

The present disclosure relates to the field of display technology, and more particularly to a method of manufacturing a light emitting panel, a light emitting panel and a display device.

BACKGROUND OF INVENTION

In recent years, with many advantages such as low manufacturing costs, high resolution, high contrast ratio and brightness, etc., liquid crystal displays (LCDs) has attracted great interest from academy research and industry, and is a display technology with great potential.

In current technology, 4Mask lithography process has become a mainstream industry trend. As panel quality requirements are continuously upgraded, performance requirements of a 4Mask device are also getting higher and higher. Reducing a convex length of an amorphous silicon layer has an obvious benefit in improving panel quality and performance, but when using copper wire as the metal wire, it will result in many problems of byproducts, leading to poor dry etching process.

Therefore, the current technology has drawbacks and in urgent need to be improved.

SUMMARY OF INVENTION

The present disclosure provides a method of manufacturing a light emitting panel, a light emitting panel, and a display device. Therefore, prevent produce relative more byproducts in dry etching process when uses copper wire as the metal wire.

First, the present disclosure provides a method of manufacturing a light emitting panel, including:
providing a substrate, forming a first metal layer on the substrate;
performing an oxidation process to the first metal layer to form an oxide layer on the first metal layer;
forming a photoresist layer on the oxide layer;
patterning the photoresist layer, the oxide layer, and the substrate, and stripping a patterned photoresist layer; and
sequentially forming a first passivation layer, a color resist layer, a second passivation layer, and an indium tin oxide film layer on the oxide layer.

In the method of manufacturing the light emitting panel of the present disclosure, wherein performing the oxidation process to the first metal layer to form the oxide layer on the first metal layer includes:
performing a dry etching process to the first metal layer and introducing oxygen to obtain the oxide layer; or
performing a heat treatment to the first metal layer in the air to obtain the oxide layer.

In the method of manufacturing the light emitting panel of the present disclosure, wherein performing the dry etching process to the first metal layer and introducing the oxygen to obtain the oxide layer at a flow rate of oxygen ranging between 5000 sccm and 10000 sccm.

In the method of manufacturing the light emitting panel of the present disclosure, wherein performing the heat treatment to the first metal layer in the air to obtain the oxide layer includes:
heating the first metal layer between 120° C. and 160° C. for 100 seconds to 140 seconds to form the oxide layer on a surface of the first metal layer.

In the method of manufacturing the light emitting panel of the present disclosure, wherein forming a photoresist layer on the oxide layer includes:
coating a photoresist material on the oxide layer; and
performing an exposure and development process to the photoresist material to form the photoresist layer.

In the method of manufacturing the light emitting panel of the present disclosure, wherein before providing the substrate and forming the first metal layer on the substrate further includes:
providing a bottom plate; and
forming a second metal layer, an insulating layer, and a semiconductor layer from bottom to top on the bottom plate by a vapor deposition process to obtain the substrate.

In the method of manufacturing the light emitting panel of the present disclosure, wherein patterning the photoresist layer, the oxide layer, and the substrate, and stripping the patterned photoresist layer includes:
performing a wet etching process to the oxide layer and the first metal layer, and performing a dry etching process to the photoresist layer and the semiconductor layer; and
peeling off the photoresist layer by a photoresist glass solution.

In the method of manufacturing the light emitting panel of the present disclosure, wherein performing the dry etching process to the semiconductor layer includes:
etching the semiconductor layer by sulfur hexafluoride and chlorine gas.

Second, the present disclosure further provides a light emitting panel, including:
a substrate, a first metal layer, a first passivation layer, a color resist layer, a second passivation layer, and an indium tin oxide film stacked in order from bottom to top;
wherein the first metal layer is spaced apart on the substrate; and
wherein the light emitting panel further comprises an oxide layer disposed between the first metal layer and the first passivation layer.

Third, the present disclosure further provides a method of manufacturing a light emitting panel, including,
providing a substrate, forming a first metal layer on the substrate;
performing a dry etching process to the first metal layer and introducing oxygen to obtain an oxide layer; or
performing a heat treatment to the first metal layer in the air to obtain the oxide layer;
coating a photoresist material on the oxide layer;
performing an exposure and development process to the photoresist material to form a photoresist layer;
patterning the photoresist layer, the oxide layer and the substrate, and stripping a patterned photoresist layer; and
sequentially forming a first passivation layer, a color resist layer, a second passivation layer, and an indium tin oxide film layer on the oxide layer.

In the method of manufacturing the light emitting panel of the present disclosure, wherein performing the dry etching process to the first metal layer and introducing oxygen to obtain the oxide layer at a flow rate of the oxygen ranging between 5000 sccm and 10000 sccm.

In the method of manufacturing the light emitting panel of the present disclosure, wherein performing the heat treatment to the first metal layer in the air to obtain the oxide layer includes:

heating the first metal layer between 120° C. and 160° C. for 100 seconds to 140 seconds to form the oxide layer on a surface of the first metal layer.

In the method of manufacturing the light emitting panel of the present disclosure, wherein before providing the substrate, and forming the first metal layer on the substrate further includes:

providing a bottom plate; and forming a second metal layer, an insulating layer, and a semiconductor layer from bottom to top on the bottom plate by a vapor deposition process to obtain the substrate.

In the method of manufacturing the light emitting panel of the present disclosure, wherein patterning the photoresist layer, the oxide layer and the substrate, and stripping the patterned photoresist layer, includes:

performing a wet etching process to the oxide layer and the first metal layer, and performing the dry etching process to the photoresist layer and the semiconductor layer;

peeling off the photoresist layer by a photoresist glass solution.

In the method of manufacturing the light emitting panel of the present disclosure, wherein performing the dry etching process to the semiconductor layer includes:

etching the semiconductor layer by sulfur hexafluoride and chlorine gas.

In the method of manufacturing the light emitting panel of the present disclosure, wherein the first metal layer comprises a molybdenum metal layer and a copper metal layer, and the oxide layer is composed of an oxide of copper.

The present disclosure provides a method of manufacturing the light emitting panel, includes: providing a substrate, forming a first metal layer on the substrate; performing an oxidation process to the first metal layer to form an oxide layer on the first metal layer; forming a photoresist layer on the oxide layer; patterning the photoresist layer, the oxide layer, and the substrate, and stripping a patterned photoresist layer; and sequentially forming a first passivation layer, a color resist layer, a second passivation layer, and an indium tin oxide film layer on the oxide layer. Therefore, prevent produce relative more byproducts in dry etching process when uses copper wire as the metal wire.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

DETAILED DESCRIPTION OF PREFERRED EMBODIMENTS

The technical solutions in the embodiments of the present disclosure will be clearly and completely described in the following with reference to the accompanying drawings in the embodiments. It is apparent that the described embodiments are only a part of the embodiments of the present disclosure, and not all of them. All other embodiments obtained by a person skilled in the art based on the embodiments of the present disclosure without creative efforts are within the scope of the present disclosure.

In current technology, 4Mask photo etching technology generally forms glass, Metal1 (Al/Mo), amorphous silicon/ohmic contact layer (G-SiNx/a-Si/n+), Metal2, passivation (P-SiNx) layer, color resist (R/G/B) layer, indium tin oxide (ITO) layer sequentially from a side of thin film transistor. The normal 4Mask process includes: performing a first wet etching process to complete etching of copper wire and molybdenum metal, in the process of reducing a convex length of an amorphous silicon/ohmic contact layer (AS), a dry etching process is performed as a photoresist ashing process, and the whole photoresist will be thinned, the part of the photoresist formed by exposure process in the semi-permeable membrane region will disappear, and the copper surface will be exposed; next, performing a dry etching process to the AS layer to completely etch away an unprotected AS layer, performing a plasma process to the exposed copper surface during the dry etching process, the exposed copper surface will react to form a copper compound; performing a second wet etching process on the metal in the middle of the channel, since the metal on the copper surface is dissociated into the copper compound, causing interference to the wet etching process at this time and resulting in incomplete etching, that forms metal remains in the middle of the channel, which leads to defects.

The present disclosure provides a display device, including: a housing and a light emitting panel, and the light emitting panel is disposed on the housing.

Figure 1:
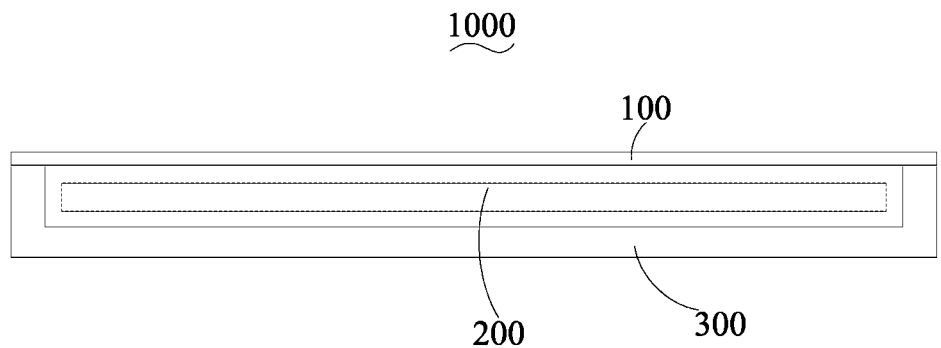
FIG. 1 is a schematic diagram showing a display device according to an embodiment of the present disclosure.

Please refer to FIG. 1. FIG. 1 is a schematic diagram of a display device 1000 of the present disclosure. The display device 1000 may include a light emitting panel 100, a control circuit 200, and a housing 300. It should be noted that the display device 1000 shown in FIG. 1 is not limited to the above, and may further include other devices, such as a camera, an antenna structure, a pattern unlocking module, and the like.

In an embodiment of the present disclosure, wherein the light emitting panel 100 is disposed on the housing 200.

In some embodiments, the light emitting panel 100 may be fixed to the housing 200, and the light emitting panel 100 and the housing 300 form a sealed space to accommodate devices such as the control circuit 200.

In some embodiments, the housing 300 can be made of a flexible material, such as a plastic housing or a silicone housing.

In an embodiment of the present disclosure, wherein the control circuit 200 is installed in the housing 300. The control circuit 200 can be a main board of the display device 1000. The control circuit 200 can be integrated with one, two or more of functional components such as a battery, an antenna structure, a microphone, a speaker, a headphone interface, a universal serial bus interface, a camera, a distance sensor, an ambient light sensor, a receiver, and a processor.

In an embodiment of the present disclosure, wherein the light emitting panel 100 is mounted in the housing 300, at the same time, the light emitting panel 100 is electrically connected to the control circuit 200 to form a display surface of the display device 1000. The light emitting panel 100 may include a display area and a non-display area. The display area can be used to display a screen of the display device 1000 or for a user to perform touch manipulation or the like. The non-display area can be used for installing various functional components.

The embodiment of the present disclosure further provides a method of manufacturing a light emitting panel, including:

providing a substrate, forming a first metal layer on the substrate;

performing a dry etching process to the first metal layer and introducing oxygen to obtain the oxide layer; or performing a heat treatment to the first metal layer in the air to obtain the oxide layer;

coating a photoresist material on the oxide layer;

performing an exposure and development process to the photoresist material to form the photoresist layer;

patterning the photoresist layer, the oxide layer, and the substrate, and stripping a patterned photoresist layer;

sequentially forming a first passivation layer, a color resist layer, a second passivation layer, and an indium tin oxide film layer on the oxide layer.

In an embodiment of the present disclosure, wherein performing the dry etching process to the first metal layer and introducing oxygen to obtain the oxide layer at a flow rate of oxygen ranging between 5000 sccm and 10000 sccm.

In an embodiment of the present disclosure, wherein performing heat treatment to the first metal layer in the air to obtain the oxide layer includes:

heating the first metal layer between 120° C. and 160° C. for 100 seconds to 140 seconds to form the oxide layer on a surface of the first metal layer.

In an embodiment of the present disclosure, wherein before providing the substrate and forming the first metal layer on the substrate further includes:

providing a bottom plate; and forming a second metal layer, an insulating layer, and a semiconductor layer from bottom to top on the bottom plate by a vapor deposition process to obtain the substrate.

In an embodiment of the present disclosure, wherein patterning the photoresist layer, the oxide layer, and the substrate, and stripping a patterned photoresist layer includes:

performing a wet etching process to the oxide layer and the first metal layer, and performing a dry etching process to the photoresist layer and the semiconductor layer; and peeling off the photoresist layer by a photoresist glass solution.

In an embodiment of the present disclosure, wherein performing the dry etching process to the semiconductor layer includes:

etching the semiconductor layer by sulfur hexafluoride and chlorine gas.

In an embodiment of the present disclosure, wherein the first metal layer includes a molybdenum metal layer and a copper metal layer, and the oxide layer is composed of an oxide of copper.

Figure 2:
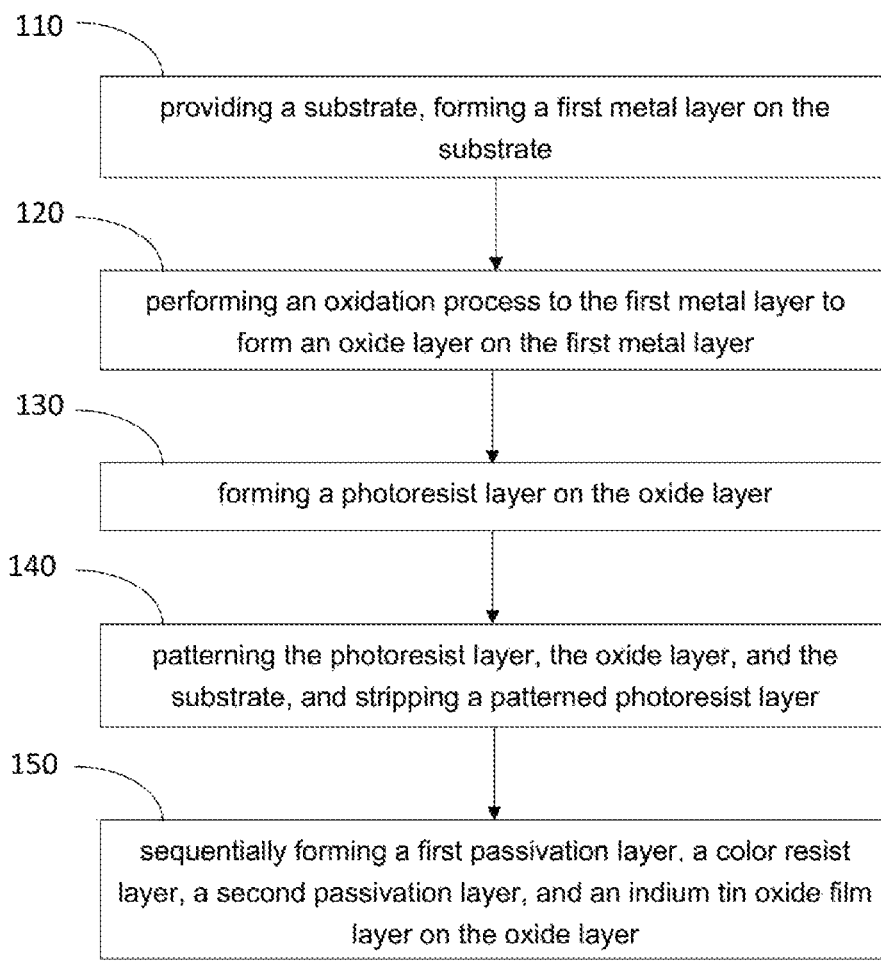
FIG. 2 is a flowchart of a method of manufacturing a light emitting panel according to an embodiment of the present disclosure.
Figure 3:
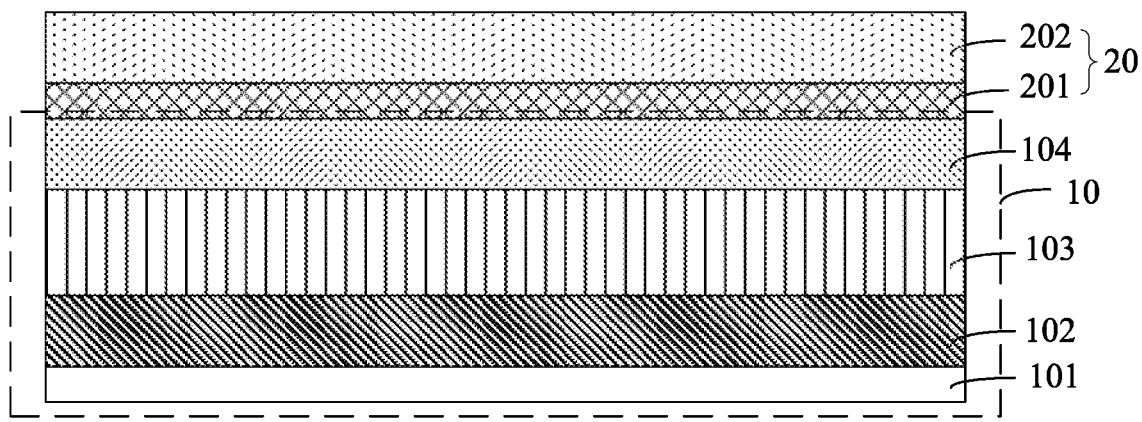
FIG. 3 is a diagram of a first intermediate product of the light emitting panel according to an embodiment of the present disclosure.

Please refer to FIG. 2. FIG. 2 is a flowchart of a method of manufacturing a light emitting panel according to an embodiment of the present disclosure. The method of manufacturing the light emitting panel includes:

Step 110, providing a substrate 110, forming a first metal layer 20 on the substrate 10;

Please refer to FIG. 3. FIG. 3 is a diagram of a first intermediate product of the light emitting panel according to an embodiment of the present disclosure. It can be understood that, since the present disclosure does not improve the preparation process, the present disclosure is directly described from the step of forming Metal2. In the present disclosure, Metal 2 is the first metal layer 20, and the first metal layer 20 includes a molybdenum metal layer 201 and a copper metal layer 202, which may be deposited on the substrate 10 by physical vapor deposition (PVD).

In an embodiment of the present disclosure, before providing the substrate and forming the first metal layer on the substrate further includes:

providing a bottom plate 101; and forming a second metal layer 102, an insulating layer 103, and a semiconductor layer 104 from bottom to top on the bottom plate 101 by a vapor deposition process to obtain the substrate 10.

Specifically, this step is a step of forming the substrate 10, which is before forming the Metal 2. In this step, a Metal 1 (ie, a second metal layer 102), an insulating layer 103, and an AS layer are sequentially formed on the substrate 101, wherein the insulating layer 103 may be made of silicon nitride, deposited by chemical vapor deposition (CVD), and the second metal layer 102 is composed of copper/molybdenum metal, which is not shown in the drawing.

Figure 4:
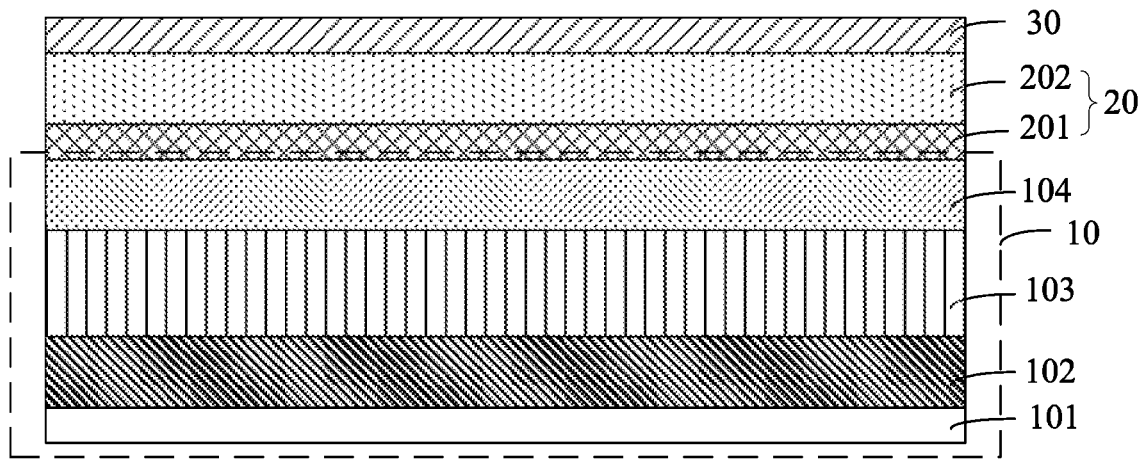
FIG. 4 is a diagram of a second intermediate product of the light emitting panel according to an embodiment of the present disclosure.

Step 120, performing an oxidation process to the first metal layer 20 to form an oxide layer 30 on the first metal layer 20;

Specifically, please refer to FIG. 4. FIG. 4 is a diagram of a second intermediate product of the light emitting panel 100 according to an embodiment of the present disclosure. It can be understood that, in order to prevent a surface of the first metal layer 20 from exposing in the subsequent process, when it is etched, it is reacted to form a copper compound. Therefore, the first metal layer 20 may be oxidized to prevent the formation of copper compounds.

In an embodiment of the present disclosure, wherein performing the oxidation process to the first metal layer 20 to form the oxide layer 30 on the first metal layer 20 includes:

performing a dry etching process to the first metal layer 20 and introducing oxygen to obtain the oxide layer 30; or performing a heat treatment to the first metal layer 20 in the air to obtain the oxide layer 30, wherein the oxide layer 30 may be composed of copper oxide.

Here, the oxidation process of the first metal layer 20 may include two methods, the first one is to use a dry etching machine to introduce oxygen into the first metal layer 20; the second one is to use a heating machine, such as an oven, to heat it in the air. When performing a dry etching process, a flow rate of the oxygen ranges between 5000 sccm and 10000 sccm. When heating with an oven machine, the first metal layer needs to be heated between 120° C. and 160° C. for 100 seconds to 140 seconds, preferably, heated to 150° C. for 120 seconds.

Figure 5:
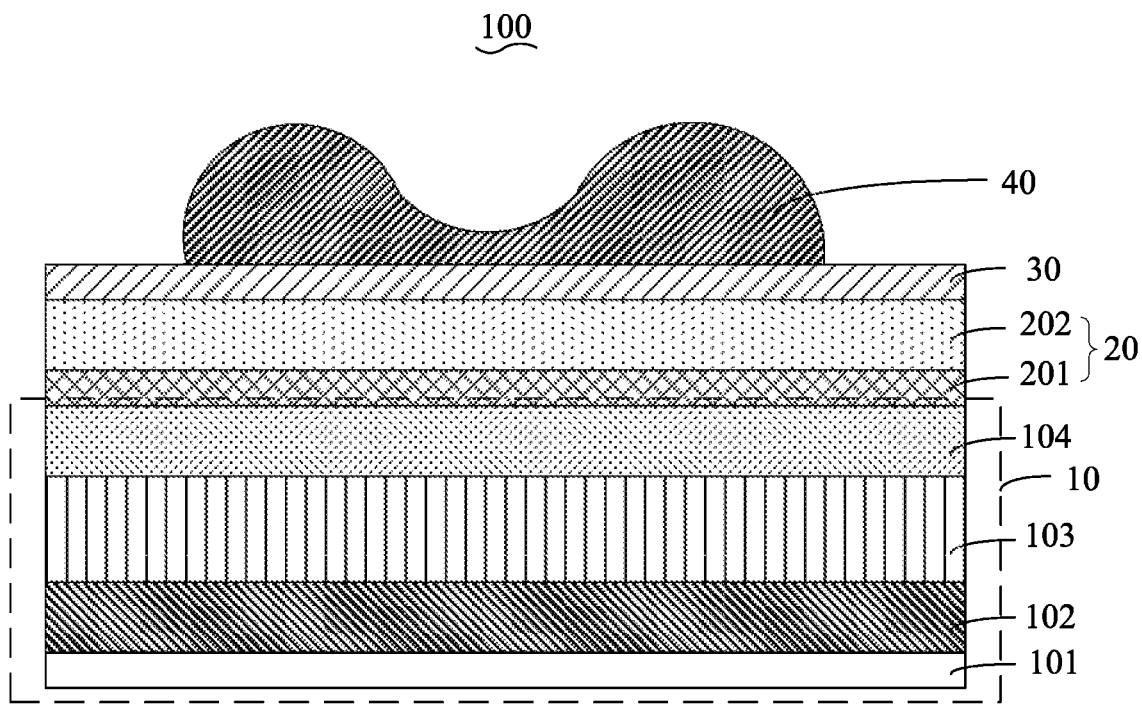
FIG. 5 is a diagram of a third intermediate product of the light emitting panel according to an embodiment of the present disclosure.

Step 130, forming a photoresist layer 40 on the oxide layer 30;

specifically, please refer to FIG. 5. FIG. 5 is a diagram of a third intermediate product of the light emitting panel according to an embodiment of the present disclosure, wherein forming the photoresist layer 40 on the oxide layer 30 includes:

coating a photoresist material on the oxide layer 30;

performing an exposure and development process to the photoresist material to form the photoresist layer 40.

Figure 6:
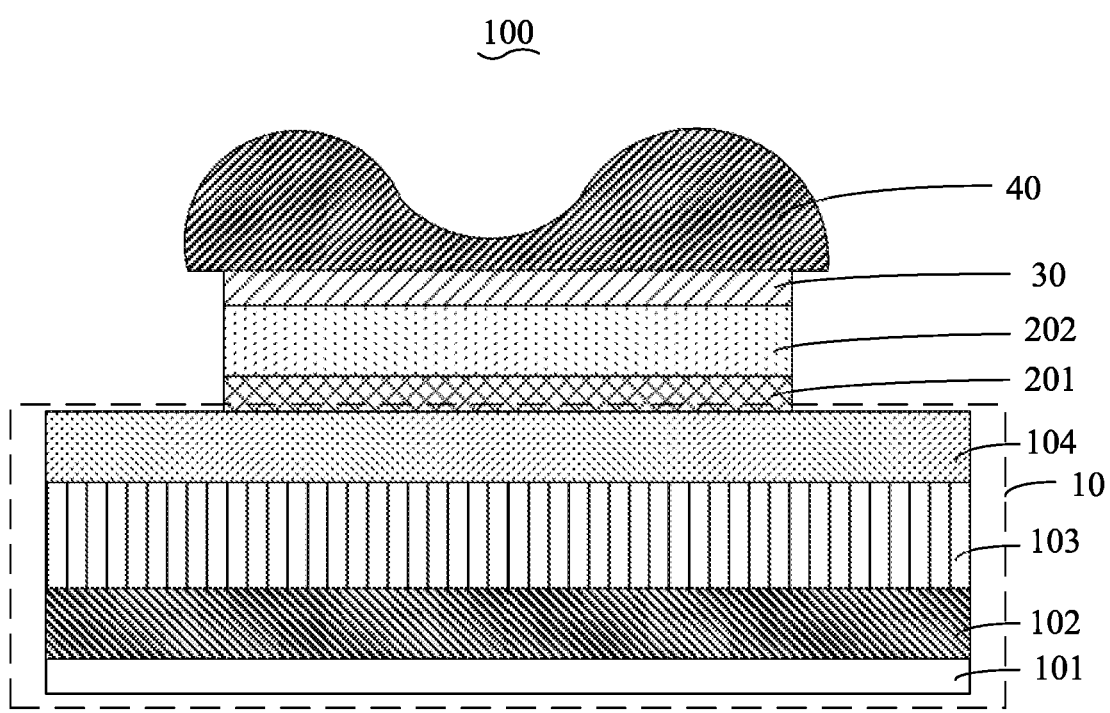
FIG. 6 is a diagram of a fourth intermediate product of the light emitting panel according to an embodiment of the present disclosure.
Figure 7:
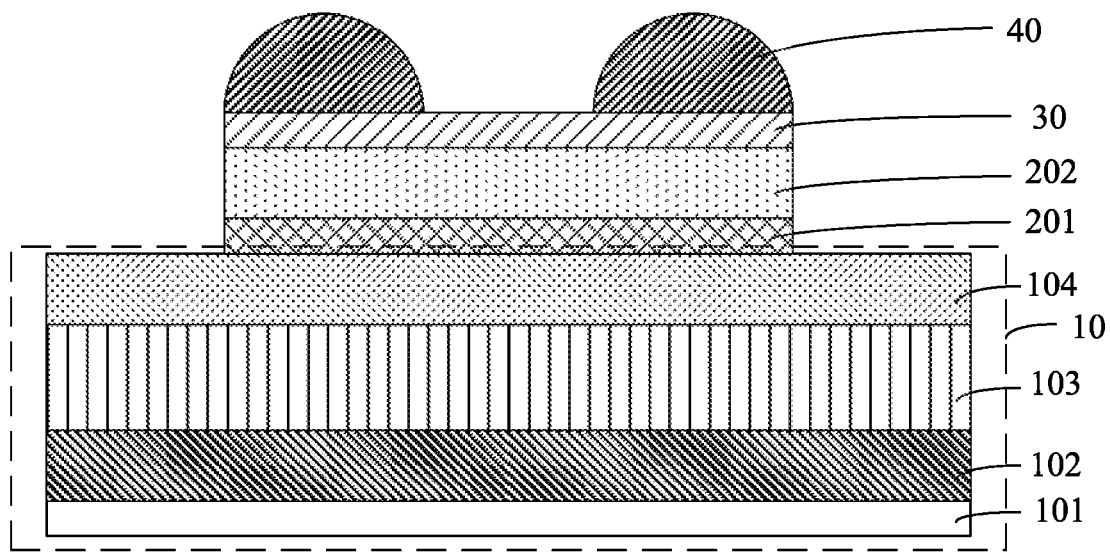
FIG. 7 is a diagram of a fifth intermediate product of the light emitting panel according to an embodiment of the present disclosure.
Figure 8:
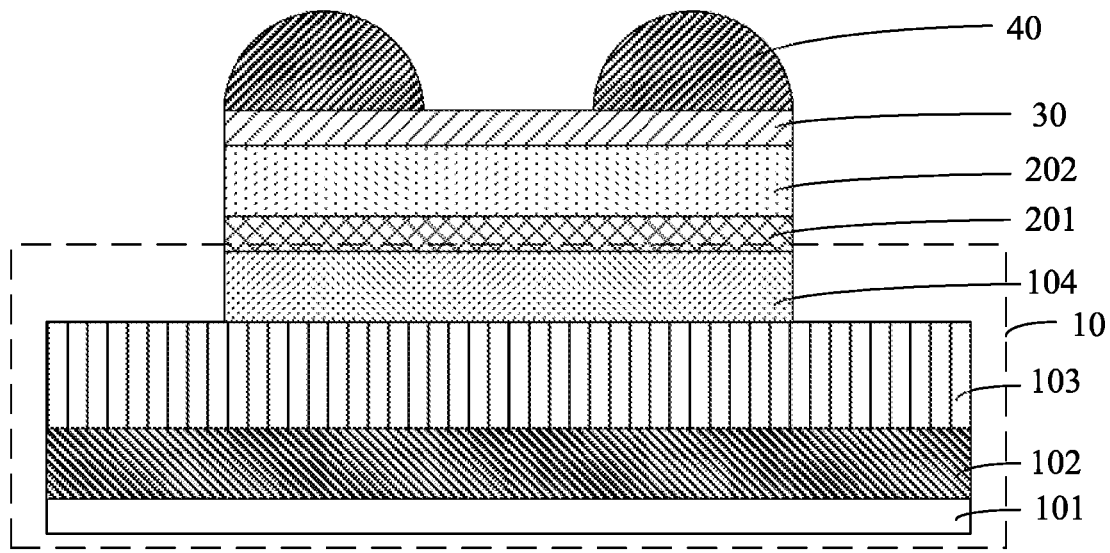
FIG. 8 is a diagram of a sixth intermediate product of the light emitting panel according to an embodiment of the present disclosure.
Figure 9:
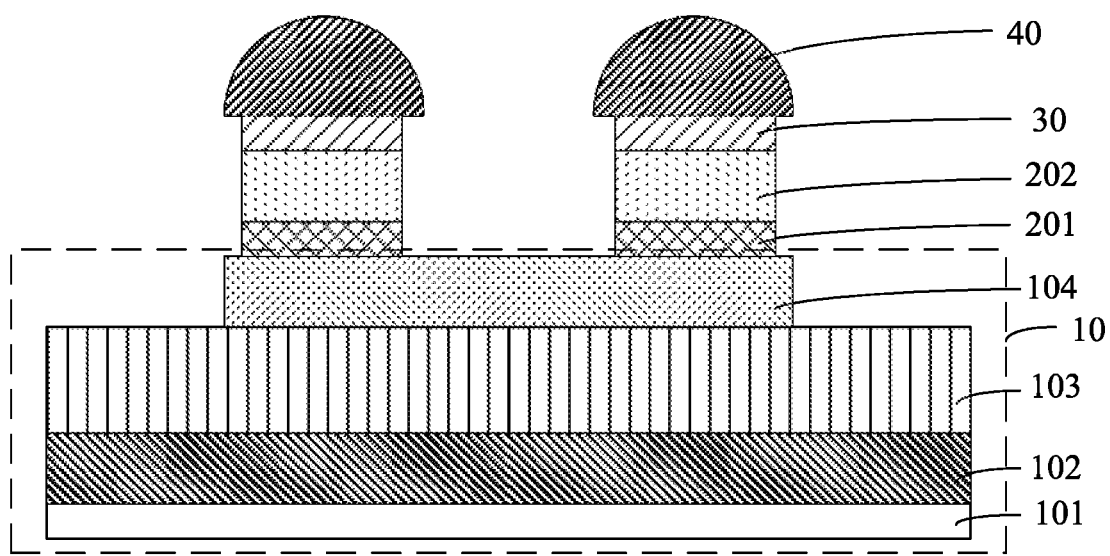
FIG. 9 is a diagram of a seventh intermediate product of the light emitting panel according to an embodiment of the present disclosure.
Figure 10:
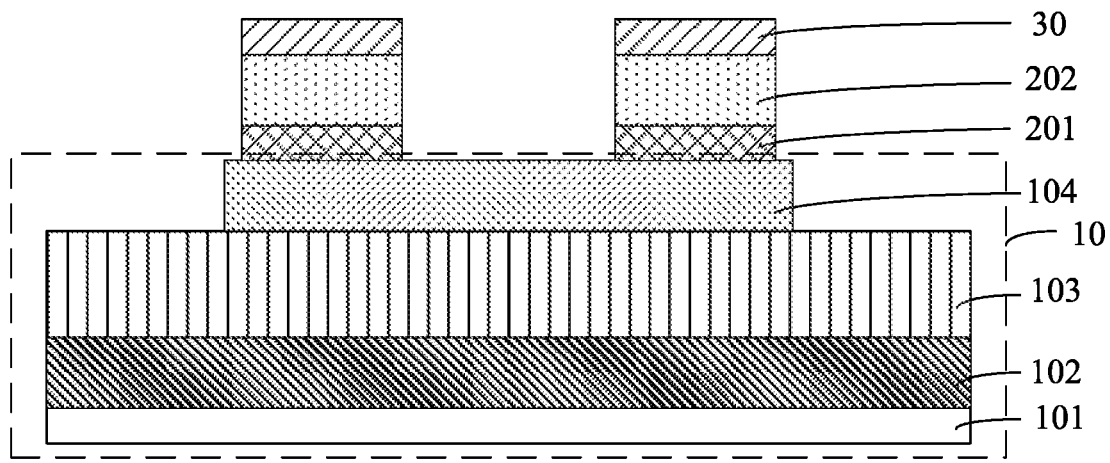
FIG. 10 is a diagram of an eighth intermediate product of the light emitting panel according to an embodiment of the present disclosure.

Step 140, patterning the photoresist layer 40, the oxide layer 30, and the substrate 10, and stripping a patterned photoresist layer 40;

wherein patterning the photoresist layer 40, the oxide layer 30, and the substrate 10, and stripping a patterned photoresist layer 40 includes:

performing a wet etching process to the oxide layer 30 and the first metal layer 20, and performing a dry etching process to the photoresist layer 40 and the semiconductor layer 104; and peeling off the photoresist layer by the photoresist glass solution. Specifically, please refer to FIG. 6, FIG. 7, FIG. 8, FIG. 9, and FIG. 10. FIG. 6 is a diagram of a fourth intermediate product of the light emitting panel 100 according to an embodiment of the present disclosure. FIG. 7 is a diagram of a fifth intermediate product of the light emitting panel 100 according to an embodiment of the present disclosure. FIG. 8 is a diagram of a sixth intermediate product of the light emitting panel 100 according to an embodiment of the present disclosure. FIG. 9 is a diagram of a seventh intermediate product of the light emitting panel 100 according to an embodiment of the present disclosure. FIG. 10 is a diagram of an eighth intermediate product of the light emitting panel 100 according to an embodiment of the present disclosure.

First, a copper etching solution is used for performing a wet etching process to reduce a horizontal width of the oxide layer 30 and the first metal layer 20, thereby obtaining the light emitting panel 100 of FIG. 6; and performing a photoresist ashing process with a dry etching machine, it is possible to introduce 4000 sccm of oxygen for about 70 seconds to obtain the light emitting panel 100 of FIG. 7; followed by performing a main etching process in the dry etching machine, that is etching the semiconductor layer 104 through sulfur hexafluoride (SF6) and chlorine gas (Cl2) generally, to etch away a part of the semiconductor layer which is unprotected by the first metal layer 20 and the photoresist layer 40, thereby obtaining the light emitting panel 100 of FIG. 8; performing the wet etching process by the copper etching solution to etch away a part of the first metal layer 20 which is unprotected by the photoresist layer 40 to obtain the light emitting panel 100 of FIG. 9; using a dry etching machine to etch a part of the semiconductor layer 104 at the channel region, wherein using SF6 or nitrogen trifluoride (NF3) for etching generally, and finally stripping the photoresist layer 40 by the photoresist glass solution to obtain the light emitting panel 100 of FIG. 10.

Step 150, sequentially forming a first passivation layer 50, a color resist layer 60, a second passivation layer 70, and an indium tin oxide film layer 80 on the oxide layer 30.

Figure 11:
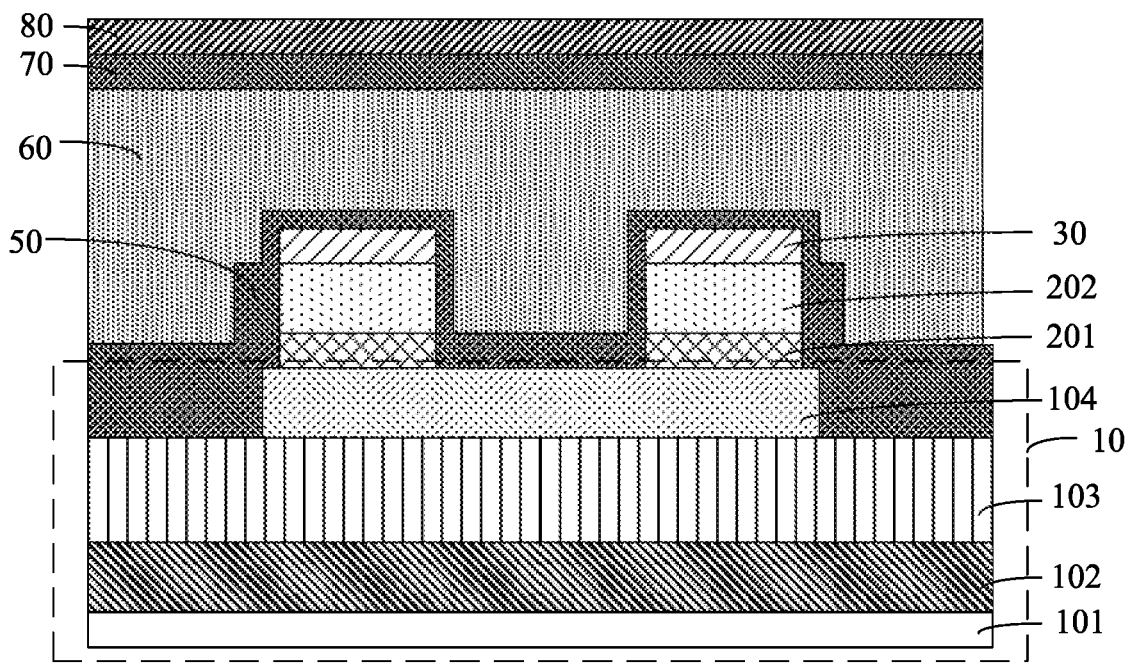
FIG. 11 is a structural schematic diagram of the light emitting panel according to an embodiment of the present disclosure.

As shown in FIG. 11, FIG. 11 is a structural schematic diagram of the light emitting panel 100 according to an embodiment of the present disclosure, wherein a method of manufacturing the light emitting panel specifically includes: forming the first passivation layer 50 on the light emitting panel 100 of FIG. 10 by CVD; sequentially forming the color resist layer 60 on the first passivation layer 50; forming the second passivation layer 70 by CVD; performing an exposure and development process to complete the pattern definition of the opening; performing a dry etching process to complete etching the silicon nitride in the opening region; depositing the indium tin oxide film layer 80 by PVD; performing an exposure and development process, and a wet etching process to complete the patterning of the indium tin oxide film layer 80; and annealing the indium tin oxide film layer 80 to obtain the molded light emitting panel 100.

The present disclosure further provides a light emitting panel 100, including:

a substrate 10, a first metal layer 20, a first passivation layer 50, a color resist layer 60, a second passivation layer 40, and an indium tin oxide film layer 80 stacked in order from bottom to top;

the first metal layer 20 is spaced apart on the substrate 10; and wherein the light emitting panel 100 further includes the oxide layer 30 disposed between the first metal layer 20 and the first passivation layer 50. The light emitting panel 100 is manufactured by the method of manufacturing the light emitting panel 100 as described above.

The present disclosure provides a method of manufacturing a light emitting panel, including: providing a substrate 10, forming a first metal layer 20 on a substrate 10; performing a oxidation process to the first metal layer 20 to form a oxide layer 30 on the first metal layer 20; forming a photoresist layer 40 on the oxide layer 30; patterning the photoresist layer 40, the oxide layer 30, and the substrate 10, and stripping a patterned photoresist layer 40; and sequentially forming a first passivation layer 50, a color resist layer 60, a second passivation layer 40, and an indium tin oxide film layer 80 on the oxide layer 30, preventing production of relatively more byproducts during a dry etching process when a copper wire is used as the metal wire.

The method of manufacturing the light emitting panel and the display device provided by the embodiments of the present disclosure are described in detail above. The principles and embodiments of the present disclosure are described in the description. The description of the above embodiments is only for helping understood the technical solutions and the core ideas thereof of the present disclosure. People skilled in the art should understand that they can still modify the technical solutions described in the foregoing embodiments, or replace some of the technical features, those modifications and substitutions do not depart from the scope of the technical solutions of the embodiments of the present disclosure.

What is claimed is:

1. A method of manufacturing a light emitting panel, comprising:

providing a substrate, forming a first metal layer on the substrate;

performing an oxidation process to the first metal layer to form an oxide layer on the first metal layer;

forming a photoresist layer on the oxide layer;

performing a wet etching process to reduce a horizontal width of the oxide layer and the first metal layer by a copper etching solution;

performing a photoresist ashing process with a dry etching machine on the photoresist layer;

etching a part of a semiconductor layer of the substrate which is unprotected by the oxide layer, the first metal layer, and the photoresist layer by sulfur hexafluoride and chlorine gas;

performing a wet etching process to etch away a part of the remaining oxide layer and a part of the remaining first metal layer which are unprotected by the photoresist layer by the copper etching solution;

etching a part of a remaining semiconductor layer of the substrate at a channel region by sulfur hexafluoride or nitrogen trifluoride, peeling off the photoresist layer by a photoresist lass solution; and sequentially forming a first passivation layer, a color resist layer, a second passivation layer, and an indium tin oxide film layer on the oxide layer;

wherein the first metal layer comprises a molybdenum metal layer and a copper metal layer, and the oxide layer is composed of an oxide of copper.

2. The method of manufacturing h light emitting panel according to claim 1, wherein performing a heat treatment to the first metal layer in the air to obtain the oxide layer comprises:

heating the first metal layer between 120° C. and 160° C. for 0 seconds to 140 seconds to form the oxide layer on a surface of the first metal layer.

3. The method of manufacturing the light emitting panel according to claim 1, wherein forming the photoresist layer or the oxide layer comprises:

coating a photoresist material on the oxide layer; and performing an exposure and development process to the photoresist material to form the photoresist layer.

4. The method of manufacturing the light emitting panel according to claim 1, wherein before providing the substrate and forming the first metal layer on the substrate further comprises:

providing a bottom plate; and forming a second metal layer, an insulating layer, and the semiconductor layer from bottom to top on the bottom plate by a vapor deposition process to obtain the substrate.

5. The method of manufacturing the light emitting panel according to claim 1, wherein performing the oxidation process to the first metal layer to form the oxide layer on the first metal layer comprises:

performing a dry etching process to the first metal layer and introducing oxygen to obtain the oxide layer; or performing a heat treatment to the first metal layer in the air to obtain the oxide layer.

6. The method of manufacturing the light emitting panel according to claim 5, wherein performing the dry etching process to the first metal layer and introducing the oxygen to obtain the oxide layer at a flow rate of oxygen ranging between 5000 sccm and 10000 sccm.

7. A method of manufacturing a light emitting panel, comprising:

providing a substrate, forming a first metal layer on the substrate;

performing a dry etching process to the first metal layer and introducing oxygen to obtain an oxide layer; or performing a heat treatment to the first metal layer in the air to obtain the oxide layer;

coating a photoresist material on the oxide layer;

performing an exposure and development process to the photoresist material to form a photoresist layer;

performing a wet etching process to reduce a horizontal width of the oxide layer and the first metal layer by a copper etching solution;

performing a photoresist ashing process with a dry etching machine on the photoresist layer;

etching a part of the semiconductor layer of the substrate which is unprotected by the oxide layer, the first metal layer, and the photoresist layer by sulfur hexafluoride and chlorine gas;

performing a wet etching process to etch away a part of the remaining oxide layer and a part of the remaining first metal layer which are unprotected by the photoresist layer by the copper etching solution;

etching a part of a remaining semiconductor layer of the substrate at a channel region by sulfur hexafluoride or nitrogen trifluoride, peeling off the photoresist layer b a photoresist glass solution; and sequentially forming a first passivation layer, a color resist layer, a second passivation layer, and an indium tin oxide film layer on the oxide layer;

wherein the first metal layer comprises a molybdenum metal layer and a copper metal layer, and the oxide layer is composed of an oxide of copper.

8. The method of manufacturing the light emitting panel according to claim 7, wherein performing the dry etching process to the first metal layer and introducing oxygen to obtain the oxide layer at a flow rate of oxygen ranging between 5000 sccm and 10000 sccm.

9. The method of manufacturing the light emitting panel according to claim 7, wherein performing a heat treatment to the first metal layer in the air to obtain the oxide layer comprises:

heating the first metal layer between 12.0° C. and 160° C. for 100 seconds to 140 seconds to form the oxide layer on a surface of the first metal layer.

10. The method of manufacturing the light emitting panel according to claim 7, wherein before providing the substrate, and forming the first metal layer on the substrate further comprises:

providing a bottom plate; and forming a second metal layer, an insulating layer, and the semiconductor layer from bottom to top on the bottom plate by a vapor deposition process to obtain the substrate.

* * * * *